(12) United States Patent
Fireaizen et al.

(10) Patent No.: US 8,855,243 B2
(45) Date of Patent: Oct. 7, 2014

(54) METHOD AND SYSTEM FOR PERFORMING COMPLEX SAMPLING OF SIGNALS BY USING TWO OR MORE SAMPLING CHANNELS AND FOR CALCULATING TIME DELAYS BETWEEN THESE CHANNELS

(71) Applicant: Elta Systems Ltd., Ashdod (IL)

(72) Inventors: Moshe Fireaizen, Halamish (IL); David Karasik, Moshav Gimzo (IL)

(73) Assignee: Elta Systems Ltd., Ashdod (IL)

( * ) Notice: Subject to any disclaimer, the term of this patent is extended or adjusted under 35 U.S.C. 154(b) by 0 days.

(21) Appl. No.: 14/019,064

(22) Filed: Sep. 5, 2013

(65) Prior Publication Data

US 2014/0005966 A1   Jan. 2, 2014

Related U.S. Application Data

(62) Division of application No. 13/103,531, filed on May 9, 2011, now Pat. No. 8,548,100.

(51) Int. Cl.
*H03D 3/22* (2006.01)
*G01R 29/027* (2006.01)
*H03M 1/12* (2006.01)

(52) U.S. Cl.
CPC ......... *G01R 29/0273* (2013.01); *H03M 1/1205* (2013.01)
USPC ....................................................... 375/332

(58) Field of Classification Search
None
See application file for complete search history.

(56) References Cited

U.S. PATENT DOCUMENTS 5,099,194 A   3/1992   Sanderson et al.
5,099,243 A   3/1992   Tsui et al.

(Continued)

FOREIGN PATENT DOCUMENTS

WO   WO 2011/012888 A2   2/2011

OTHER PUBLICATIONS

Huang Yong, Xiao xianci, Lin yunsong, "Second-order Sampling Based Fast Recovery of Bandpass Signals", Signal Processing Proceedings, 1998. ICSP '98.*

(Continued)

*Primary Examiner* — Chieh M Fan
*Assistant Examiner* — Bahman Badipour
(74) *Attorney, Agent, or Firm* — Oliff PLC

(57) ABSTRACT

A method and system for performing complex sampling of signals using two or more sampling channels and calculating time delays between these channels. The system and method are operable to enable complex sampling of a signal in a frequency-domain by predefined-order sampling, including utilizing a sampling channel for converting an analog signal to a corresponding substantially non-delayed digital signal; and transforming the digital signal into a plurality of corresponding frequency-domain substantially non-delayed discrete components; providing additional sampling channels enabling to perform a predefined-order sampling, the predefined-order depending on a number of the additional sampling channels, each additional sampling channel configured to perform a number of stage, giving rise to the multiplied frequency-domain delayed discrete components; and combining the multiplied frequency-domain delayed discrete components with the corresponding frequency-domain substantially non-delayed discrete components, giving rise to an output frequency-domain complex signal.

6 Claims, 5 Drawing Sheets

(56) References Cited

U.S. PATENT DOCUMENTS

| | | | |
|---|---|---|---|
| 5,109,188 A | | 4/1992 | Sanderson et al. |
| 5,420,888 A * | | 5/1995 | Davis et al. ............... 375/334 |
| 8,089,382 B2 * | | 1/2012 | Pagnanelli ............... 341/143 |
| 2005/0273320 A1 * | | 12/2005 | Yamaguchi et al. ......... 704/205 |
| 2007/0140382 A1 * | | 6/2007 | Qian ............... 375/332 |
| 2009/0322578 A1 * | | 12/2009 | Petrovic ............... 341/155 |
| 2010/0293214 A1 * | | 11/2010 | Longley ............... 708/313 |
| 2011/0110471 A1 * | | 5/2011 | Park et al. ............... 375/344 |
| 2012/0095323 A1 * | | 4/2012 | Eskandari et al. ......... 600/411 |

OTHER PUBLICATIONS

Jae-Hyung Kim, Hongmei Wang, Hyung-Jung Kim, Jin-Up Kim, "Bandpass Sampling Digital Frontend Architecture for Multi-band Access Cognitive Radio", IEEE "GLOBECOM" 2009 proceedings.*

Zhiyu Ru, Eric A.M. Klumperink, and Bram Nauta, "On the Suitability of Discrete-Time Receivers for Software-Defined Radio", IEEE 2007.*

Kohlenberg, "Exact Interpolation of Band-Limited Functions," *Journal of Applied Physics*, Dec. 1953, pp. 1432-1436, vol. 24, No. 12.

Vaughan et al., "The Theory of Bandpass Sampling," *IEEE Transactions on Signal Processing*, Sep. 1991, pp. 1973-1984, vol. 39, No. 9.

Valkama et al., "A Novel Image Rejection Architecture for Quadrature Radio Receivers," *IEEE Transactions on Circuits and Systems, II: Express Briefs*, Feb. 2004, pp. 61-67, vol. 51, No. 2.

Valkama et al., "Second-Order Sampling of Wideband Signals," *IEEE International Symposium on Circuits and Systems*, May 2001, pp. 801-804, vol. 2.

Huang Yong et al., "Second-Order Sampling Based Fast Recovery of Bandpass Signals," Signal Processing Proceedings, ICSP, Fourth International Conference on Beijing, China, IEEE, Oct. 12-16, 1998, pp. 7-10, Piscataway, New Jersey, USA.

Kim et al., "Bandpass Sampling Digital Frontend Architecture for Multi-band Access Cognitive Radio," Global Telecommunications Conference, Nov. 30, 2009, pp. 1-6.

Sun et al., "Generalized Quadrature Bandpass Sampling with FIR Filtering," Conference Proceedings/IEEE International Symposium on Circuits and Systems (ISCAS), May 23-26, 2005, pp. 4429-4432.

Ru et al., "On the Suitability of Discrete-Time Receivers for Software-Defined Radio," *Circuits and Systems*, 2007, ISCAS 2007, IEEE International Symposium, IEEE, May 2007, pp. 2522-2525.

* cited by examiner

METHOD AND SYSTEM FOR PERFORMING COMPLEX SAMPLING OF SIGNALS BY USING TWO OR MORE SAMPLING CHANNELS AND FOR CALCULATING TIME DELAYS BETWEEN THESE CHANNELS

REFERENCE TO CO-PENDING APPLICATIONS

This application is a Divisional of application Ser. No. 13/103,531 filed May 9, 2011. The disclosure of the prior application is hereby incorporated by reference herein in its entirety.

FIELD OF THE INVENTION

The present invention relates to digital signal processing. More particularly, the present invention relates to a method and system for performing complex sampling of signals by using two or more sampling channels (second-order sampling or higher) and calculating corresponding time delays between the two or more sampling channels.

DEFINITIONS, ACRONYMS AND ABBREVIATIONS

Throughout this specification, the following definitions are employed:

Signal Sampling: is the process of converting a signal (e.g., that continuously varies in time or space) into a numeric sequence (e.g., having discrete values in time or space). It should be noted that a sampler is, generally, a system/device or operation(s) that enables extracting (producing) one or more samples from a signal. A theoretical ideal sampler produces samples equivalent to the instantaneous value of the continuous signal at one or more desired points in time or space.

Complex Sampling: is a sampling, in which an input signal is sampled, for example, by two samplers (sampling channels) that are shifted by ninety degrees, each relative to another. The output signal of the above sampling is a complex signal.

Complex Signal: is a signal consisting of real and imaginary parts. For example, if a complex signal is denoted X(t), then $X(t)=x_{real}(t)+i \cdot x_{imaginary}(t)$, wherein $i=\sqrt{-1}$. It should be noted that in actual physical systems, signals $x_{real}(t)$ and $x_{imaginary}(t)$ are both real, but are called the "real" and "imaginary" parts. The multiplier i is used to help define an operation(s) between different signals.

FFT: is an acronym for Fast Fourier Transform, which is an efficient algorithm to compute Discrete Fourier Transform (DFT) and its inverse. There are many distinct FFT algorithms in the art, involving a wide range of mathematic calculations, from simple complex-number arithmetic to group theory and number theory. Generally, the output of the Fast Fourier Transform is called the FFT spectrum.

FFT Bin: is a single frequency component of the FFT spectrum.

BACKGROUND OF THE INVENTION

The subject matter of signal sampling is widely known in the prior art. Generally, it relates to digital signal processing and has high relevance in a variety of fields, such as communication, electronics, medicine, electro-optics, and many others. For example, in radio communication, sampling a signal and obtaining sufficient signal attenuation, while demodulating the desired signal from radio frequencies as close as possible to the baseband, is one of the main tasks. According to the commonly known Nyquist-Shannon sampling theorem, which is well known in the field of information theory, and in particular, in the field of digital signal processing and telecommunications, an analog signal that has been sampled can be fully reconstructed from the samples if the sampling frequency $F_S$ exceeds 2B samples per second (2B is a Nyquist rate that is the minimum sampling rate required to avoid aliasing), where B is the bandwidth of the original signal, i.e. $F_S>2B$ or $F_S/2>B$ (half of the sampling rate is larger than the signal bandwidth). However, the above theorem is valid when the signal frequency range does not contain whole multiples or half-multiples of the sampling rate (sampling frequency).

It should be noted that signals that are used in many applications are, in many cases, band limited to a predefined frequency interval, and thus these signals are called bandpass signals. A uniform sampling theorem for bandpass signal is known from the prior art, and its analysis is usually based on the time frequency equivalence. Thus, for example, A. W. Kohlenberg proposed the second order sampling for a bandpass signal (in the article titled "Exact interpolation of band-limited functions", published in the journal of Applied Physics, in 1953, issue 24(12), pages 1432-1436), which is considered to be the simplest case of non-uniform sampling where two uniform sampling sequences are interleaved. Second order sampling allows the theoretical minimal sampling rate of two-times bandwidth, in the form of an average rate, to be applied independent of the band position. In second order sampling, when the delay τ between two or more samplers is properly predefined, the signal can be fully reconstructed (e.g., by performing signal interpolation) even when the signal frequency range contains whole multiples or half-multiples of the sampling frequency.

FIG. 1A schematically illustrates a conventional interpolation system 100 of second order sampling, according to the prior art. In FIG. 1A, the input signal X(t) (t is a time parameter) passes through two Analog-to-Digital (A/D) converters 105' and 105" with a predefined time delay τ between them. Then, the converted signals $X_1(l)$ and $X_2(l)$ are inputted into interpolation filters 110' and 110", respectively, for performing signal interpolation, which includes digital to analog conversion. After that, the resulting interpolated signals are summed together, giving rise to the output signal Y(l), and in turn Y(t).

It should be noted that second order sampling and its limitations are well-known in the prior art, and this issue is discussed in the literature. For example, R. G. Vaughan et al., in the article titled "The Theory of Bandpass Sampling" published in the "IEEE Transactions on Signal Processing" journal (volume 39, number 2, pp. 1973-1984, September 1991), discusses sampling of bandpass signals with respect to band position, noise considerations, and parameter sensitivity, presenting acceptable and unacceptable sample rates with specific discussion of the practical rates which are non-minimum. According to Vaughan et al., the construction of a bandpass signal from second-order samples depends on sampling factors and the relative delay between the uniform sampling streams. For another example, M. Valkama et al., in the article titled "A Novel Image Rejection Architecture for Quadrature Radio Receivers" published in the "IEEE Transactions on Circuits and Systems" journal (volume 51, number 2, pp. 61-68, February 2004), presents a novel structure for obtaining an image-free baseband observation of the received bandpass signal by utilizing I/Q (Inphase/Quadrature) signal processing. The phase difference between I and Q branches is approximated by a relative time delay of one quarter of the carrier cycle. Also, Valkama et al. presents and analyzes an analog delay processing based model, and then determines the obtainable image rejection of the delay processing. In addition, Valkama et al. in another article titled "Second-Order Sampling of Wideband Signals", published in the "IEEE International Symposium on Circuits and Systems" journal (volume 2, pp. 801-804, May 2001), discusses and analyzes the second-order sampling based digital demodulation technique. According to Valkama et al., the modest image rejection of the basic second-order sampling scheme is improved to provide sufficient demodulation performance also for wideband receivers. Further, for example, H. Yong et al. in the article titled "Second-Order Based Fast Recovery of Bandpass Signals", published in the "International Conference on Signal Processing Proceedings" journal (volume 1, pp. 7-10, 1998), discusses fast recovery and frequency-differencing of real bandpass signals based on second-order sampling. According to H. Yong et al., by using second-order sampling, the sampling rate can be lowered to the bandwidth. Although the spectrum of the two interleaved sampling streams are aliasing, it is possible to reconstruct the original or frequency-differencing bandpass signal.

Further, it should be noted that the conventional complex signal processing is also used in processing schemes where an input signal is bandpass in its origin, and is to be processed in a lowpass form. This normally requires two-channel processing in quadrature channels to remove an ambiguity as to whether a signal is higher or lower than the bandpass center frequency. The complex signal processing can be extended to the digital signal processing field, and the processed signal can be first mixed to zero-center frequency in two quadrature channels, then filtered to remove the high frequency mixing products, and after that digitized by a number of A/D (Analog-to-Digital) converters.

According to the prior art, FIG. 1B schematically illustrates a conventional complex sampling system 160, in which an input signal is sampled in two sampling channels 150' and 150", while shifting the phase by ninety degrees. At the output of such a system, a complex signal is obtained, said signal having a real part Re{X(l)} and an imaginary part Im{X(l)}, wherein parameter l represents a series of discrete values. Filters 151, 152' and 152" are used to filter the undesired frequency range (in a time domain) of input signals X(t), $X_1'(t)$ and $X_2'(t)$, respectively.

U.S. Pat. No. 5,099,194 discloses an approach to extending the frequency range uses non-uniform sampling to gain the advantages of a high sampling rate with only a modest increase in the number of samples. Two sets of uniform samples with slightly different sampling frequency are used. Each set of samples is Fourier transformed independently and the frequency of the lowest aliases determined. It is shown that knowledge of these two alias frequencies permits unambiguous determination of the signal frequency over a range far exceeding the Nyquist frequency, except at a discrete set of points.

U.S. Pat. No. 5,099,243 presents a technique for extending the frequency range which employs in-phase and quadrature components of the signal coupled with non-uniform sampling to gain the advantages of a high sampling rate with only a small increase in the number of samples. By shifting the phase of the local oscillator by 90 degrees, a quadrature IF signal can be generated. Both in-phase and quadrature components are sampled and the samples are combined to form a complex signal. When this signal is transformed, only one alias is obtained per periodic repetition and the effective Nyquist frequency is doubled. Two sets of complex samples are then used with the slightly different sampling frequency. Each set is independently Fourier transformed and the frequency of the lowest aliases permits unambiguous determination of the signal frequency over a range far exceeding the Nyquist frequency.

U.S. Pat. No. 5,109,188 teaches a technique for extending the frequency range which employs a power divider having two outputs, one output being supplied to a first Analog-to-Digital (A/D) converter, and the other output being supplied via a delay device to a second A/D converter. A processor receives the outputs of the two A/D converters. In operation, the input signal is subjected to a known delay and both original and delayed signals are sampled simultaneously. Both sampled signals are Fourier transformed and the phase and amplitudes calculated. The phase difference between the original and delayed signals is also calculated, and an approximation to the true frequency for each peak observed in the amplitude spectrum is estimated.

Based on the above observations, there is a continuous need in the art to provide a method and system configured to perform complex sampling of signals by using two or more sampling channels (second-order sampling or higher) and enabling operating with a signal bandwidth that can be equal to the sampling frequency (or to higher multiples of the sampling frequency). In addition, there is a need in the art to provide a method and system for performing signal processing by using second order (or higher order) sampling, in a frequency domain, without considering whether the signal frequency range contains whole multiples or half-multiples of the sampling frequency. Further, there is a continuous need in the prior art to enable calculating corresponding time delays between the two or more sampling channels in a relatively accurate manner.

SUMMARY OF THE INVENTION

The present invention relates to a method and system for performing complex sampling of signals by using two or more sampling channels (second-order sampling or higher) and calculating corresponding time delays between the two or more sampling channels.

A system is configured to perform a complex sampling of a signal in a frequency-domain by means of a predefined-order sampling, said system comprising:
  a) a sampling channel comprising:
    a.1. at least one analog-to-digital converter configured to convert an analog signal to a corresponding substantially non-delayed digital signal; and
    a.2. at least one frequency-domain discrete transformation unit for transforming said digital signal to a plurality of corresponding frequency-domain substantially non-delayed discrete components;
  b) one or more additional sampling channels enabling to perform a predefined-order sampling, the predefined-order depending on a number of said one or more additional sampling channels, each additional sampling channel comprising:
    b.1. at least one delay unit configured to delay an analog signal by a predefined value, giving rise to a delayed analog signal;
    b.2. at least one analog-to-digital converter configured to convert said delayed analog signal to a corresponding delayed digital signal;
    b.3. at least one frequency-domain discrete transformation unit for transforming said delayed digital signal to a plurality of frequency-domain delayed discrete components;

b.4. at least one data unit configured to provided one or more corresponding coefficients for each frequency-domain delayed discrete component; and b.5. at least one multiplication unit configured to multiply said one or more corresponding coefficients with said each corresponding frequency-domain delayed discrete component, giving rise to the multiplied frequency-domain delayed discrete components; and c) at least one summation unit for summing said multiplied frequency-domain delayed discrete components with the corresponding frequency-domain substantially non-delayed discrete components, giving rise to an output frequency-domain complex signal.

According to an embodiment of the present invention, the one or more coefficients are at least one of the following:

a) phase coefficients; and
b) gain coefficients.

According to an embodiment of the present invention, the frequency-domain transformation is a Fourier transform.

According to another embodiment of the present invention, the Fourier transform is the FFT (Fast Fourier Transform).

According to still another embodiment of the present invention, an inverse frequency-domain transformation is applied on the output frequency-domain complex signal for obtaining an output time-domain complex signal.

According to still another embodiment of the present invention, the inverse frequency-domain transformation is the IFFT (Inverse FFT).

According to a further embodiment of the present invention, the system further comprises a processing unit configured to calculate a time delay between two or more sampling channels.

According to still a further embodiment of the present invention, the output frequency-domain complex signal has a predefined frequency spectrum that comprises one or more predefined frequencies, which are whole multiples and/or half-multiples of a sampling frequency, according to which the analog signal is sampled.

According to another embodiment of the present invention, a system is configured to perform a complex sampling of a signal in a frequency-domain, said system comprising:

a) a non-delayed sampling channel module configured to provide a plurality of frequency-domain substantially non-delayed discrete signal components; and b) one or more additional sampling channel modules, each additional sampling channel module comprising at least one delay unit and at least one coefficient unit for enabling providing a plurality of frequency-domain delayed discrete components, said plurality of frequency-domain delayed discrete components being adapted to a specific frequency band, wherein said system is further configured to combine the delayed discrete components with the corresponding substantially non-delayed discrete components, for generating an output frequency-domain complex signal.

According to another embodiment of the present invention, the coefficient unit provides coefficients for the specific frequency band.

According to still another embodiment of the present invention, a system is configured to perform a complex sampling of a signal in a time-domain by means of a predefined-order sampling, said system comprising:

a) a sampling channel comprising:
a.1. at least one analog-to-digital converter configured to convert an analog signal to a corresponding time-domain substantially non-delayed digital signal;

b) one or more additional sampling channels enabling to perform a predefined-order sampling, the predefined-order depending on a number of said one or more additional sampling channels, each additional sampling channel comprising:

b.1. at least one delay unit configured to delay an analog signal by a predefined value, giving rise to a delayed analog signal;

b.2. at least one analog-to-digital converter configured to convert said delayed analog signal to a corresponding delayed digital signal; and b.3. at least one complex digital filter to be applied to said delayed digital signal for generating complex samples of said delayed digital signal, giving rise to a complex time-domain delayed digital signal; and c) at least one summation unit for combining the real portion of said complex time-domain delayed digital signal with said time-domain substantially non-delayed digital signal, giving rise to a combined digital signal, and thereby giving a rise to an output time-domain complex signal, the real portion of which is said combined digital signal and the imaginary portion of which is the imaginary portion of said complex time-domain delayed digital signal.

According to still another embodiment of the present invention, the digital filter is a FIR (Finite Impulse Response) filter.

According to a further embodiment of the present invention, a system is configured to perform a complex sampling of a signal in a time-domain, said system comprising:

a) a non-delayed sampling channel module configured to provide a time-domain substantially non-delayed digital signal; and b) one or more additional sampling channel modules, each additional sampling channel module comprising at least one delay unit and at least one complex digital filter unit for enabling providing a complex time-domain delayed digital signal, wherein the real portion of said complex time-domain delayed digital signal is further combined with said time-domain substantially non-delayed digital signal, giving rise to a combined digital signal, and thereby giving a rise to an output time-domain complex signal, the real portion of which is said combined digital signal and the imaginary portion of which is the imaginary portion of said complex time-domain delayed digital signal.

According to an embodiment of the present invention, a method of performing complex sampling of a signal in a frequency-domain by means of a predefined-order sampling, said method comprising:

a) providing a sampling channel configured to:
a.1. convert an analog signal to a corresponding substantially non-delayed digital signal; and
a.2. transform said digital signal to a plurality of corresponding frequency-domain substantially non-delayed discrete components;

b) providing one or more additional sampling channels enabling to perform a predefined-order sampling, the predefined-order depending on a number of said one or more additional sampling channels, each additional sampling channel configured to:

b.1. delay an analog signal by a predefined value, giving rise to a delayed analog signal;
b.2. convert said delayed analog signal to a corresponding delayed digital signal;
b.3. transform said delayed digital signal to a plurality of frequency-domain delayed discrete components;

b.4. provide one or more corresponding coefficients for each frequency-domain delayed discrete component; and b.5. multiply said one or more corresponding coefficients with said each corresponding frequency-domain delayed discrete component, giving rise to the multiplied frequency-domain delayed discrete components; and c) combining said multiplied frequency-domain delayed discrete components with the corresponding frequency-domain substantially non-delayed discrete components, giving rise to an output frequency-domain complex signal.

According to another embodiment of the present invention, a method of performing a complex sampling of a signal in a frequency-domain, said method comprising:

a) generating a plurality of frequency-domain substantially non-delayed discrete signal components;

b) generating a plurality of frequency-domain delayed discrete components, said plurality of frequency-domain delayed discrete components being adapted to a specific frequency band by means of one or more corresponding coefficients; and c) combining the delayed discrete components with the corresponding substantially non-delayed discrete components, for generating an output frequency-domain complex signal.

According to still another embodiment of the present invention, a method of performing complex sampling of a signal in a time-domain by means of a predefined-order sampling, said method comprising:

a) providing a sampling channel for converting an analog signal to a corresponding time-domain substantially non-delayed digital signal;

b) providing one or more additional sampling channels enabling to perform a predefined-order sampling, the predefined-order depending on a number of said one or more additional sampling channels, each additional sampling channel configured to:

b.1. delay an analog signal by a predefined value, giving rise to a delayed analog signal;

b.2. convert said delayed analog signal to a corresponding delayed digital signal; and b.3. generate complex samples of said delayed digital signal, giving rise to a complex time-domain delayed digital signal; and c) combining the real portion of said complex time-domain delayed digital signal with said time-domain substantially non-delayed digital signal, giving rise to a combined digital signal, and thereby giving a rise to an output time-domain complex signal, the real portion of which is said combined digital signal and the imaginary portion of which is the imaginary portion of said complex time-domain delayed digital signal.

According to still another embodiment of the present invention, the method further comprises generating the complex time-domain delayed digital signal by using a digital filter.

According to a further embodiment of the present invention, a method of performing a complex sampling of a signal in a time-domain, said method comprising:

a) generating a time-domain substantially non-delayed digital signal;

b) generating a complex time-domain delayed digital signal; and c) combining the real portion of said complex time-domain delayed digital signal with said time-domain substantially non-delayed digital signal, giving rise to a combined digital signal, and thereby giving a rise to an output time-domain complex signal, the real portion of which is said combined digital signal and the imaginary portion of which is the imaginary portion of said complex time-domain delayed digital signal.

According to an embodiment of the present invention, a method of calculating a time delay between two or more sampling channels in a signal processing system, said method comprising:

a) providing a first sampling channel for enabling sampling of a substantially non-delayed signal; and b) providing one or more additional sampling channels, each sampling channel providing a predefined delay $\tau$ to said signal, giving rise to a delayed signal, and then enabling sampling of said delayed signal, wherein said predefined delay $\tau$ is calculated by using the relationship between said delay $\tau$ and the phase difference $\Delta\phi$ of said delayed signal.

According to another embodiment of the present invention, the method further comprises defining the relationship between the time delay $\tau$ and the phase difference $\Delta\phi$ by means of at least one of the following:

a) $2\cdot\pi\cdot f_1\cdot\tau = \Delta\phi_1 + 2\cdot\pi\cdot N$; and b) $2\cdot\pi\cdot(f_1+\Delta f)\cdot\tau = \Delta\phi_2\cdot\pi\cdot(N+M)$, wherein $\Delta\phi_1$ is a phase difference of a first delayed signal having a first predefined frequency $f_1$, $\Delta\phi_2$ is a phase difference of a second delayed signal having a second predefined frequency $f_2$, $\Delta f$ is a difference between said second and first predefined frequencies, thereby $f_2 = f_1 + \Delta f$, and M and N are predefined integers.

According to still another embodiment of the present invention, the method further comprises determining the bound of integer M by using the following relationship:

$$M = \tau\cdot\Delta f - \frac{\Delta\phi_2 - \Delta\phi_1}{2\pi}.$$

According to still another embodiment of the present invention, the method further comprises determining the approximation of the integer M by considering that $0 < \Delta\phi_1 < 2\pi$ and $0 < \Delta\phi_2 < 2\pi$.

According to still another embodiment of the present invention, the method further comprises determining the approximation of the integer M by considering that $\Delta f$ is predefined.

According to a further embodiment of the present invention, the method further comprises measuring frequency differences $\Delta f_{12}$ and $\Delta f_{13}$ between the first predefined frequency $f_1$, the second predefined frequency $f_2$ and a third predefined frequency $f_3$, giving rise to frequency differences $\Delta f_{12} = f_2 - f_1$ and $\Delta f_{13} = f_3 - f_1$.

According to still a further embodiment of the present invention, the method further comprises calculating the time delay $\tau$ approximation by using the one or more of the following:

a) $\tau = \frac{\Delta\phi_2 - \Delta\phi_1}{2\pi\cdot\Delta f_{12}} + \frac{M_1}{\Delta f_{12}}$; and -continued $$\tau = \frac{\Delta\phi_3 - \Delta\phi_1}{2\pi \cdot \Delta f_{13}} + \frac{M_2}{\Delta f_{13}}, \quad b)$$

wherein $\Delta\phi_3$ is a phase difference of a third delayed signal having a third predefined frequency $f_3$, and $M_1$ and $M_2$ are integers.

According to still a further embodiment of the present invention, the method further comprises using the calculated time delay $\tau$ approximation for determining a value of the integer M.

According to still a further embodiment of the present invention, the method further comprises determining a value of the integer N by using the determined value of the integer M.

According to still a further embodiment of the present invention, the method further comprises calculating the time delay $\tau$ by using both determined values of the integers M and N.

BRIEF DESCRIPTION OF THE DRAWINGS

In order to understand the invention and to see how it may be carried out in practice, various embodiments will now be described, by way of non-limiting examples only, with reference to the accompanying drawings, in which.

Figure 1A:
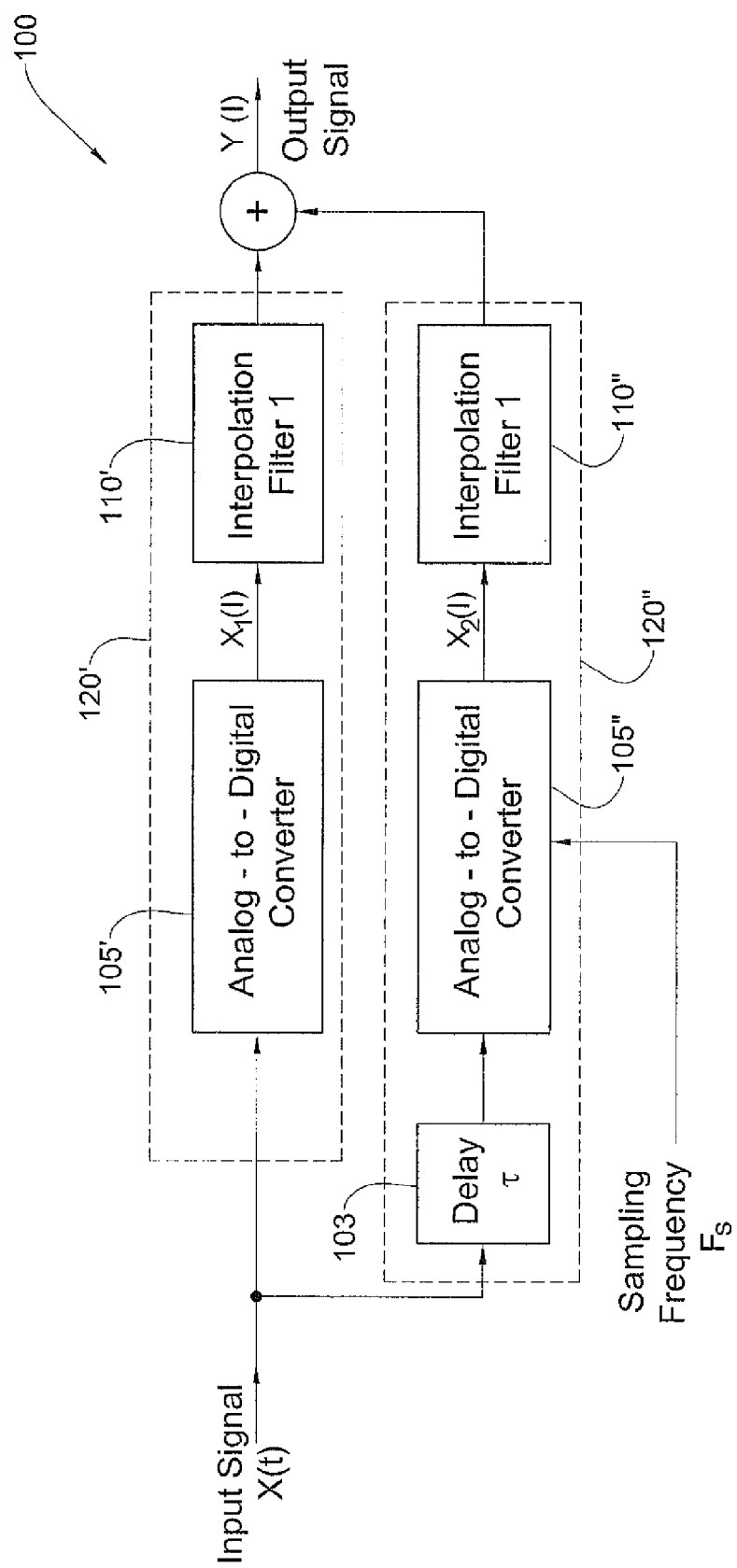
FIG. 1A schematically illustrates a conventional interpolation system of second order sampling, according to the prior art.
Figure 1B:
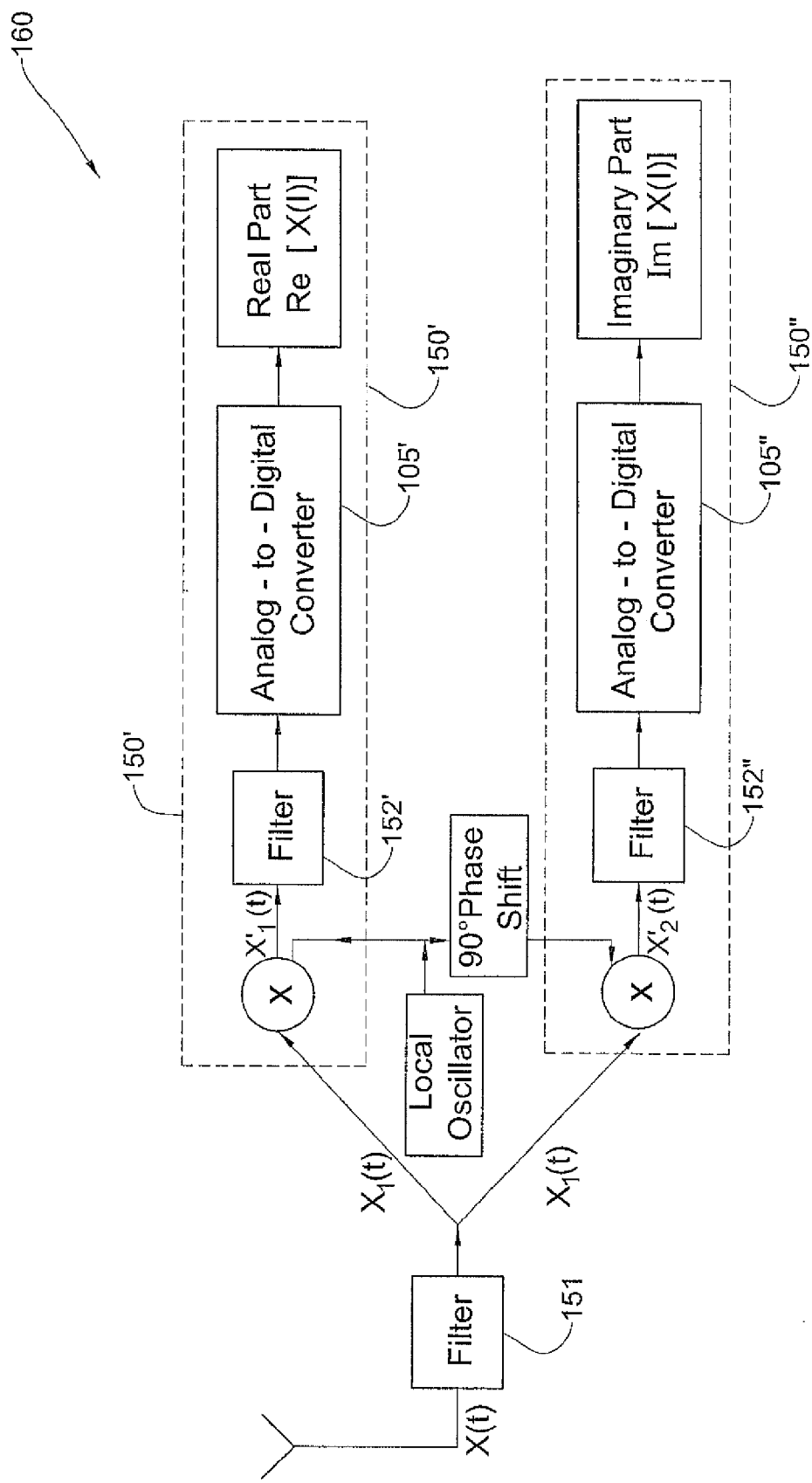
FIG. 1B schematically illustrates a conventional complex sampling system, in which an input signal is sampled in two sampling channels, while shifting the phase by ninety degrees, according to the prior art.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE EMBODIMENTS

Unless specifically stated otherwise, as apparent from the following teachings, it is noted that throughout the specification utilizing terms such as "processing", "computing", "calculating", "determining", or the like, refer to the action and/or processes of a computer (machine) that manipulate and/or transform data into other data, said data represented as physical, e.g. such as electronic, quantities. The term "computer" should be expansively construed to cover any kind of electronic device with data processing capabilities, comprising, by the way of non-limiting examples, personal computers, servers, computing systems/units, communication devices, processors (e.g., digital signal processors (DSPs), microcontrollers, field programmable gate arrays (FPGAs), application specific integrated circuits (ASICs), etc.), and any other electronic computing devices. Also it should be noted that operations in accordance with the teachings herein may be performed by a computer that is specially constructed for the desired purposes or by a general purpose computer that is specially configured for the desired purpose by means of a computer program stored in a computer readable storage medium.

Figure 2:
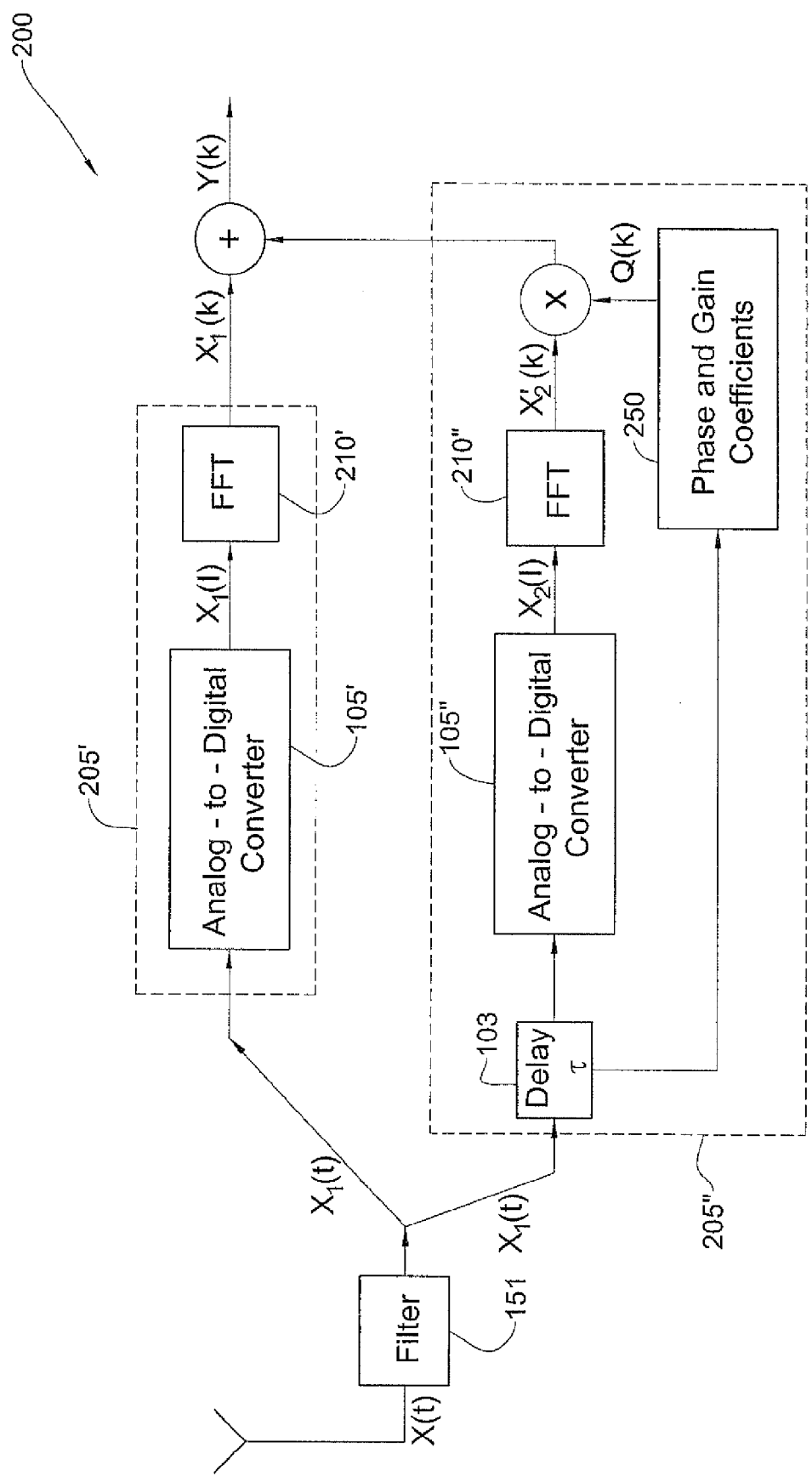
FIG. 2 is a schematic illustration of complex sampling in a frequency domain by performing second-order sampling, according to an embodiment of the present invention.

FIG. 2 is a schematic illustration 200 of complex sampling in a frequency domain by performing second-order sampling, according to an embodiment of the present invention. According to this embodiment, input signal X(t) is first filtered by means of filter 151 in order to remove the undesired frequency range (in a time domain). Then, the filtered signal $X_1(t)$ is sampled by means of two sampling channels (systems/modules) 205' and 205", having a predefined time delay $\tau$ between them, and then is converted to corresponding digital signals by means of conventional A/D converters 105' and 105", giving rise to $X_1(l)$ and $X_2(l)$ signals respectively. After that, digital signals $X_1(l)$ and $X_2(l)$ are processed and converted to a frequency domain by means of the FFT (Fast Fourier Transform), which is a conventional technique for performing a discrete Fourier transform. As a result, discrete signals $X_1'(k)$ and $X_2'(k)$ are obtained, wherein k is an index. It should be noted that the frequency band of input analog signal X(t) is known (the frequency bandwidth is equal to the sampling frequency Fs), and therefore the phase difference of each frequency component of the delayed signal $X_2'(k)$, which is provided via delayed sampling channel 205", can be calculated. According to an embodiment of the present invention, the frequency spectrum of delayed signal $X_2'(k)$ is multiplied by a corresponding set of predefined phase and gain coefficients Q(k) 250, each having a gain and phase (e.g., Q(k)= $g_k \cdot \exp(i \cdot \Delta\phi_k)$, wherein k is an index). Then, the spectrum of delayed signal $X_2'(k)$ is summed (combined) with the spectrum of signal $X_1'(k)$, giving rise to (generating) signal Y(k) that has a spectrum being equivalent to the spectrum of a complex signal, which can be also obtained by means of conventional complex sampling.

According to an embodiment of the present invention, the desired time delay $\tau$ may be different for different frequency bands. Further, the time delay $\tau$ may be obtained either by providing time delay component/unit 103 (in which the time delay $\tau$ can be predefined) or by performing a phase difference (e.g., a phase shift) of a sampling frequency, leading to a desired time delay of a signal. It should be noted that one or more phase and gain coefficients Q(k) 250 are used for (are applied to) each frequency component of signal $X_2'(k)$. These phase and gain coefficients Q(k), provided within the corresponding coefficients data unit 250, can be predefined, for example, empirically by substantially accurate measuring of the above time delay r. It should be noted that even in a case when time delay $\tau$ is a frequency-dependent component, the corresponding phase and gain coefficients Q(k) can be still calculated and predefined thereof.

According to an embodiment of the present invention, the phase and gain coefficients are pre-calculated during the calibration process of system 200, and then are stored within the memory means (not shown), while there is a need for a coefficient for each frequency component of signal $X_2'(k)$, after applying the FFT transform. Further, for calculating the corresponding phase difference $\Delta\phi(k)$, there is a need to provide a signal of a predefined frequency, and then calculate the corresponding phase difference $\Delta\phi(k)$ between the delayed and reference signals $X_2'(k)$ and $X'(k)$, respectively. In addition, it should be noted that the power ratio between two channels (the non-delayed channel 205' and delayed channel 205") is calculated and corresponding gain coefficients g, (k is an index) are determined and stored within memory means (not shown) for later usage. This can be achieved in several ways, according to various embodiments of the present invention. According to one embodiment of the present invention, substantially all frequencies that correspond to the FFT frequency component to be calculated are provided, and then a phase difference for each such component is calculated. If it is supposed, for example, that the frequency range is $(F_s, 2F_s)$ and the FFT length is N, then the set of frequencies f(k) that correspond to the FFT frequency components are:

$$f(k) = F_s + \frac{k}{N} \cdot F_s, \text{ for } k = 0, \ldots, N-1 \quad (1)$$

For each of the above N frequencies, the phase difference $\Delta\phi$ between the sampling channels 205' and 205" is calculated.

According to another embodiment of the present invention, a number of frequencies are provided in intervals that are greater than the FFT bin (bin is defined as F/N, wherein N represents a number of FFT frequency components), and then the phase difference for each provided frequency is calculated by performing interpolation for each FFT frequency component. Thus, for example, if the frequency range is $(F_s, 2F_s)$ and N/16 frequencies are provided, then the set of frequencies that correspond to the FFT frequency components are:

$$f(m) = Fs + \frac{16m}{N} \cdot Fs, \text{ for } m = 0, \ldots, N/16 - 1 \quad (2)$$

According to this embodiment, for each of the above N/16 frequencies, the phase difference $\Delta\phi$ between the sampling channels 205' and 205" is calculated. After that, the phase differences for each frequency component is calculated by performing interpolation of the corresponding phase difference $\Delta\phi$ for each FFT frequency component of signal $X_2'(k)$:

$$\Delta\varphi(k; 16m \leq k < 16m+15) = \Delta\phi(m) + \frac{k-16m}{16}(\Delta\phi(m+1) - \Delta\phi(m)) \quad (3)$$

According to a further embodiment of the present invention, a relatively small number of frequencies are provided in non-uniform frequency intervals, and then the phase differences $\Delta\phi(m)$ between these frequencies are determined. After that, the time delay $\tau$ is calculated by using the above-determined phase differences $\Delta\phi(m)$ by means of a novel method for calculating time delays between sampling channels (such as channels 205' and 205"), according to an embodiment of the present invention. The phase differences $\Delta\phi(m)$ for each FFT frequency component can be calculated by using the following equation:

$$\Delta\phi = \text{mod}(2\pi \cdot f \cdot \tau)_{2\pi} \quad (4)$$

wherein f is a frequency, and $\text{mod}(\cdot)_{2\pi}$ is a "modulo" mathematical operator.

In general, when a real signal (having frequency f) is received, and the FFT (having length N) of said signal is calculated, then the resulting signal will appear at the frequency spectrum as a frequency component of the FFT bin k (generally, a FFT bin is a single frequency of the FFT, to which each frequency component contributes):

$$f = F_s \cdot \left(n + \frac{k}{N}\right) \quad (5)$$

wherein f is a signal frequency; Fs is a sampling frequency; N is the FFT length; n is an integer; and k is a FFT bin number. Also, an additional (for example, undesired) frequency component appears in the FFT bin (N−k), due to the symmetry of the conventional FFT. It should be noted that the phase difference $\Delta\phi_{N-k}$ of the above undesired frequency component has an opposite sign compared to the phase difference $\Delta\phi_k$ of the desired frequency component that appears in the FFT bin k.

According to an embodiment of the present invention, in order to cancel the above undesired frequency component appearing in the FFT bin (N−k), the frequency components can be summed (combined) by using the following equation:

$$Y(k) = X_1'(k) - g_{N-k} \cdot \exp(i \cdot \Delta\phi_{N-k}) \cdot X_2'(k) \quad (6)$$

wherein $\Delta\phi_{N-k}$ is a predefined phase difference of the frequency component that contributes to bin N−k; $g_{N-k}$ is a gain coefficient calculated for that frequency component; $X_1'(k)$ and $X_2'(k)$ are corresponding frequency components of non-delayed and delayed signals, respectively; and Y(k) represents frequency components at the output of system 200. As a result, the frequency spectrum of the output signal Y(k) is equivalent to the frequency spectrum of the conventional complex sampling.

It should be noted that according to an embodiment of the present invention, when a complex sampling is required in a time domain, then an inverse frequency-domain transformation, such as the Inverse Fourier transform (IFFT), can be performed on the frequency spectrum obtained by implementing system 200.

According to an embodiment of the present invention, time delays (time differences) between sampling channels (such as channels 205' and 205" (FIG. 2)) can be calculated in a relatively accurate manner (for example, by means of a processing unit/system), as described below in detail. According to this embodiment, the corresponding time delay $\tau$ can be calculated by using the following relationship between the time delay $\tau$ and phase difference $\Delta\phi$:

$$2 \cdot \pi \cdot f_1 \cdot \tau = \Delta\phi_1 + 2 \cdot \pi \cdot N \quad (7)$$

and $$2 \cdot \pi \cdot (f_1 + \Delta f) \cdot \tau = \Delta\phi_2 + 2 \cdot \pi \cdot (N+M) \quad (8)$$

wherein $\Delta\phi_1$ is a phase difference of a signal having frequency $f_1$; $\Delta\phi_2$ is a phase difference of a signal having frequency $f_2$, while $f_2 = f_1 + \Delta f$; and M and N are integers. It should be noted that the above two equations have three variables: time delay $\tau$, integer M and integer N.

For the bound range of values of time delay $\tau$, the bound for integer M can be determined by using the following equation, which is a result of subtracting equation (8) from equation (7):

$$M = \tau \cdot \Delta f - \frac{\Delta\phi_2 - \Delta\phi_1}{2\pi} \quad (9)$$

In such a way, the first approximation of integer M can be determined, considering that $0 < \Delta\phi_1 < 2\pi$ and $0 < \Delta\phi_2 < 2\pi$, and considering that $\Delta f$ is known.

Further, by measuring frequency differences $\Delta f_{12}$ and $\Delta f_{13}$ between three predefined frequencies $f_1$, $f_2$ and $f_3$, such that $\Delta f_{12} = f_2 - f_1$ and $\Delta f_{13} = f_3 - f_1$, the corresponding time delay $\tau$ can be calculated by dividing the above equation (9) by said frequency differences $\Delta f_{12}$ and $\Delta f_{13}$, respectively:

$$\tau = \frac{\Delta \phi_2 - \Delta \phi_1}{2\pi \cdot \Delta f_{12}} + \frac{M_1}{\Delta f_{12}} \text{ and} \quad (10)$$

$$\tau = \frac{\Delta \phi_3 - \Delta \phi_1}{2\pi \cdot \Delta f_{13}} + \frac{M_2}{\Delta f_{13}} \quad (11)$$

wherein $M_1$ and $M_2$ are bounded integers. Then, as a result, the following equation is obtained:

$$\frac{\Delta \phi_2 - \Delta \phi_1}{2\pi \cdot \Delta f_{12}} + \frac{M_1}{\Delta f_{12}} = \frac{\Delta \phi_3 - \Delta \phi_1}{2\pi \cdot \Delta f_{13}} + \frac{M_2}{\Delta f_{13}} \quad (12)$$

Thus, considering that $M_1$ and $M_2$ are bounded integers, and also phase differences $\Delta \phi_1$, $\Delta \phi_2$, $\Delta \phi_3$ and frequency differences $\Delta f_{12}$, $\Delta f_{13}$ are all known, then the first approximation of time delay $\tau$ can be determined. This time delay approximation can be inserted in equation (9) for obtaining a value of M in a relatively accurate manner, considering that M is a bounded integer. Then, after determining the value of M, the value of N can be also determined by inserting the determined value of M into equations (7) and (8). As a result, both bounded integers M and N are determined, and the time delay $\tau$ is calculated in a relatively accurate manner by using the same equations (7) and (8).

It should be noted that according to an embodiment of the present invention, the range of time delays $\tau$ can be selected in the following way. It is supposed, for example, that the frequencies are within the range of $[F_{start}, F_{start}+BW]$, wherein $F_s$ is a starting frequency, and BW is a bandwidth, while $F_s \geq BW$ ($F_s$ is a sampling frequency). The gain (in dB (Decibels)) for the desired frequency component (of the FFT) can be presented by the following equation:

$$10 \log_{10}\left(2\left|\sin\left(\frac{\Delta \varphi_k + \Delta \varphi_{N-k}}{2}\right)\right|^2\right) \quad (13)$$

wherein $\Delta \phi_k$ is the phase difference of the frequency component that appears in the FFT bin k, when the frequency is $$f = \left(n + \frac{k}{N}\right) \cdot F_s;$$

and $\Delta \phi_{N-k}$ is the phase difference of the frequency component that appears in the FFT bin N-k, when the frequency is $$f = \left(\tilde{n} + \frac{N-k}{N}\right) \cdot F_s.$$

If $nF_s \geq F_{start} > (n-1) \cdot F_s$, then the phase difference $\Delta \phi_k$ is presented by:

$$\Delta \varphi_k = 2\pi \left(n + \frac{k}{N}\right) \cdot F_s \cdot \tau \quad (14)$$

wherein n is an integer, and $\tau$ is a time delay, which can be, for example, in the range determined by the following equation:

$$\frac{5}{6 \cdot (2n+1)} > F_s \cdot \tau > \frac{1}{6 \cdot (2n-1)} \quad (15)$$

It should be noted that selecting the delay $\tau$ within the above range ensures that in addition to removing the undesired frequency component (FFT bin (N-k)) of the 15 frequency spectrum, the power of the desired frequency component (FFT bin k) will not be decreased more than 3 dB (Decibels), as shown in the equation below:

$$10 \log_{10}\left(2\left|\sin\left(\frac{\Delta \varphi_k + \Delta \varphi_{N-k}}{2}\right)\right|^2\right) > -3 \, \text{dB} \quad (16)$$

wherein $\Delta \phi_k$ and $\Delta \phi_{N-k}$ are phase differences in bins k and (N-k), respectively. In addition, it should be noted that any other constraints can be considered, such as ensuring that the power of the desired frequency component will not be decreased, for example, more than 2 dB (instead of 3 dB), and the like.

Figure 3:
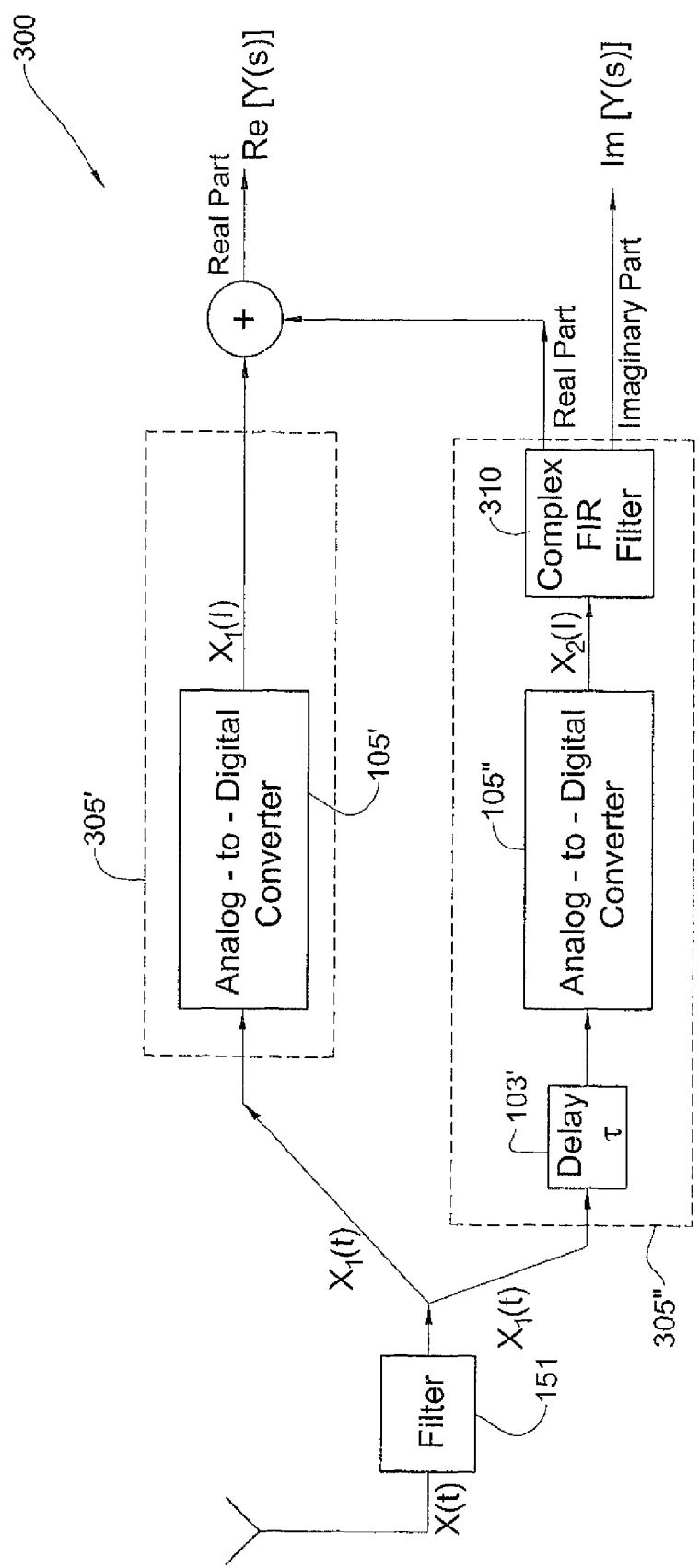
FIG. 3 is a schematic illustration of a complex sampling system, performing sampling in a time domain, according to another embodiment of the present invention.

FIG. 3 is a schematic illustration of a complex sampling system 300, performing sampling in a time domain, according to another embodiment of the present invention. According to this embodiment of the present invention, signal $X_2(l)$ passes through a digital FIR (Finite Impulse Response) filter unit 310. This filter is a complex filter and at its output, complex signal samples are obtained. The real part of the signal samples after FIR filter 310 is added to signal $X_1(l)$ that is outputted from A/D converter 105', giving rise to Re{Y(s)} signal, which is a real part of the signal, to which the complex sampling is applied. On the other hand, in the delayed sampling channel 305", the imaginary part of the signal samples, after passing via the FIR filter 310, is the imaginary part (Im{Y(s)}) of the signal, to which the complex sampling is applied.

According to an embodiment of the present invention, the FIR filter coefficients h(p) can be obtained by applying an inverse Fast Fourier transform (IFFT) on phase and gain coefficients Q(k) 250 (FIG. 2):

$$h(p) = \frac{1}{N} \sum_{k=0}^{N-1} g_k \cdot \exp(i \cdot \Delta \phi_k) \cdot \exp\left(2\pi \cdot i \frac{k \cdot p}{N}\right) \quad (17)$$

wherein $g_k$ and $\Delta \phi_k$ are a gain and phase difference, respectively, of the corresponding signal passing via delayed sampling channel 305"; k and p are indices; i is $\sqrt{-1}$; and N is a number of frequency components. It should be noted that each phase and gain 20 coefficient Q(k) can be equal to $g_k \cdot \exp(i \cdot \Delta \phi_k)$, which is indicated within the above expression of h(p).

Figure 4:
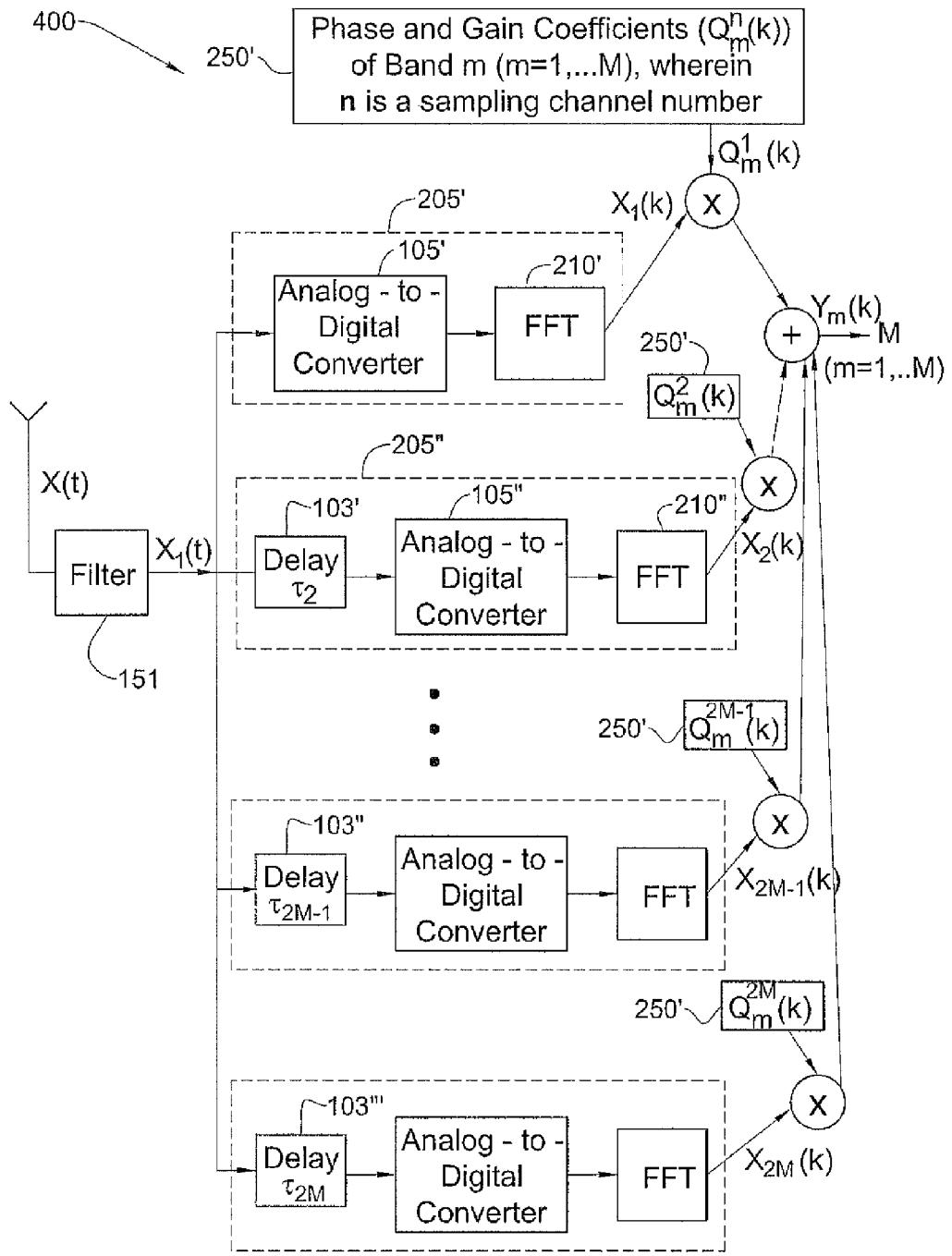
FIG. 4 is a schematic illustration of a system for complex sampling by performing sampling of 2M-order, according to still another embodiment of the present invention.

FIG. 4 is a schematic illustration of a system 400 for complex sampling by performing sampling of the 2M-order sampling (the predefined-order sampling), according to still another embodiment of the present invention. According to this embodiment, if providing 2M sampling channels (two or more sampling channels) with predefined delays $\tau_1, \tau_2, \ldots, \tau_n$ between them, then operating with signal bandwidth $BW = M \cdot F_s$ becomes possible, wherein $F_s$ is a sampling frequency. This can be compared to system 200 (FIG. 2), for which signal bandwidth BW is less or equal to the sampling frequency: $BW \leq F_s$.

It is supposed, for example, that sampling channels 205', 205", etc. are represented by index n, while n∈[1, 2M]. The output frequency bands (Band 1, Band 2, etc.) are represented by index m, while m∈[1, M]. In addition, each FFT bin is numbered by index k. The FFT of a signal is calculated in each sampling channel and is represented as $X_n(k)$, the output frequency spectrum is represented as $Y_m(k)$, and phase and gain coefficients 250' are shown as $Q_m^n(k)$. Thus, according to an embodiment of the present invention, the output frequency signal $Y_m(k)$ can be calculated by using the following equation, in which each at least one phase and gain coefficient $Q_m^n(k)$ is multiplied with its corresponding signal $X_n(k)$:

$$Y_m(k) = \sum_{n=1}^{2M} Q_m^n(k) \cdot X_n(k) \tag{18}$$

It can be further supposed, for example, that input frequency F belongs to Band M if $F \in [F_{start}+(m-1)F_s, F_{start}+m \cdot F_s]$, wherein $F_{start}$ is a starting frequency that is defined manually or automatically according to the need of a user of system 400; and $F_s$ is a sampling frequency, while m∈[1, M]. Also, the frequency appears in the FFT bin, if one of the following two equations takes place:

$$\text{round}\left(\text{mod}(F, F_s) \cdot \frac{N}{F_s}\right) = k \text{ or} \tag{19}$$

$$\text{round}\left(\text{mod}(F, F_s) \cdot \frac{N}{F_s}\right) = (N-k)$$

wherein k and (N−k) are corresponding FFT bins; N is the FFT length; and mod(·) is a "modulo" mathematical operator.

The phase difference $\Delta\phi_n^m(k)$ of each corresponding frequency component depends on frequency $F^m(k)$ (of FFT bin k in Band m (m∈[1, M])) and on the sampling channel delay $\tau_1, \tau_2, \ldots, \tau_n$, as shown in the following equation:

$$\Delta\phi_n^m(k) = 2\pi \cdot F^m(k) \cdot \tau_n \tag{20}$$

It should be noted that the frequency spectrum of a signal $X_n(k)$ passing via each corresponding sampling channel (such as sampling channels 205', 205", etc.) is composed of frequencies received from all bands (such as Band 1, Band 2, etc.). Thus, signals from 2M possible frequency sources are provided to the corresponding bin k of the FFT, as presented in the following equation.

$$X_n(k) = \sum_{m=1}^{M} \left[ X(F^m(k)) \cdot e^{i\Delta\varphi_n^m(k)} + X^*(F^m(N-k)) \cdot e^{-i\Delta\varphi_n^m(N-k)} \right] \tag{21}$$

As a result, the corresponding matrices of signals $X_n(k)$ can be presented as follows:

$$\begin{pmatrix} X_1(k) \\ X_2(k) \\ \vdots \\ X_{2M-1}(k) \\ X_{2M}(k) \end{pmatrix} = \begin{pmatrix} e^{i\Delta\varphi_1^1(k)} & e^{-i\Delta\varphi_1^1(N-k)} & \cdots & e^{-i\Delta\varphi_1^M(N-k)} \\ e^{i\Delta\varphi_2^1(k)} & \vdots & \ddots & \vdots \\ \vdots & \vdots & \ddots & \vdots \\ e^{i\Delta\varphi_{2M-1}^1(k)} & \vdots & \ddots & \vdots \\ e^{i\Delta\varphi_{2M}^1(k)} & e^{-i\Delta\varphi_{2M}^1(N-k)} & \cdots & e^{-i\Delta\varphi_{2M}^M(N-k)} \end{pmatrix} \cdot \tag{22}$$

$$\begin{pmatrix} X(F^1(k)) \\ X^*(F^1(N-k)) \\ \vdots \\ X(F^M(k)) \\ X^*(F^M(N-k)) \end{pmatrix}$$

wherein k and (N−k) are corresponding FFT bins; and N is the FFT length. If it is supposed, for example, that P(k) matrix is defined as follows:

$$P(K) = \begin{pmatrix} e^{i\Delta\varphi_1^1(k)} & e^{-i\Delta\varphi_1^1(N-k)} & \cdots & e^{-i\Delta\varphi_1^M(N-k)} \\ e^{i\Delta\varphi_2^1(k)} & \vdots & \ddots & \vdots \\ \vdots & \vdots & \ddots & \vdots \\ e^{i\Delta\varphi_{2M-1}^1(k)} & \vdots & \ddots & \vdots \\ e^{i\Delta\varphi_{2M}^1(k)} & e^{-i\Delta\varphi_{2M}^1(N-k)} & \cdots & e^{-i\Delta\varphi_{2M}^M(N-k)} \end{pmatrix} \tag{23}$$

then, by further considering that the desired frequency spectrum at the output is $$Y_m(k) = X(F^m(k))) = \sum_{n=1}^{2M} Q_m^n(k) \cdot X_n(k)$$

(i.e., the output signal $Y_m(k)$ is adapted to a specific frequency band/spectrum), the corresponding phase and gain coefficients $Q_m^n(k)$ can be calculated by inverting the matrix P(k) and obtaining:

$$Q_m^n(k) = \begin{pmatrix} 1 & 0 & \cdots & 0 & 0 \\ \vdots & \ddots & \ddots & \ddots & \vdots \\ 0 & 0 & \cdots & 1 & 0 \end{pmatrix} \cdot P^{-1}(k) \tag{24}$$

Thus, for example, if M=2, the phase and gain coefficients $Q_m^n(k)$ are equal to:

$$Q_m^n(k) = \begin{pmatrix} 1 & 0 & 0 & 0 \\ 0 & 0 & 1 & 0 \end{pmatrix} \cdot P^{-1}(k) \tag{25}$$

For another example, if M=3, then the phase and gain coefficients $Q_m^n(k)$ are equal to:

$$Q_m^n(k) = \begin{pmatrix} 1 & 0 & 0 & 0 & 0 & 0 \\ 0 & 0 & 1 & 0 & 0 & 0 \\ 0 & 0 & 0 & 0 & 1 & 0 \end{pmatrix} \cdot P^{-1}(k) \tag{26}$$

According to an embodiment of the present invention, the constraint for selecting time delay values in this case can be such that P(k) matrix is not singular, which means that the determinant of said P(k) matrix does not become equal to zero or almost equal to zero (i.e., there are no two or more substantially equal time delays τ, for example).

While some embodiments of the invention have been described by way of illustration, it will be apparent that the invention can be put into practice with many modifications, variations and adaptations, and with the use of numerous equivalents or alternative solutions that are within the scope of persons skilled in the art, without departing from the spirit of the invention or exceeding the scope of the claims.

The invention claimed is:

1. A method of calculating a time delay between two or more sampling channels in a signal processing system, said method comprising:
   a) providing a first sampling channel for enabling sampling of a substantially non-delayed signal; and
   b) providing one or more additional sampling channels, each sampling channel providing a predefined delay τ to said signal, giving rise to a delayed signal, and then enabling sampling of said delayed signal, wherein said predefined delay τ is calculated by using the relationship between said delay τ and a phase difference Δϕ of said delayed signal;
   c) defining the relationship between the time delay τ and the phase difference Δϕ by means of at least one of the following:

a) $2 \cdot \pi \cdot f_1 \cdot \tau = \Delta\phi_1 + 2 \cdot \pi \cdot N$; and b) $2 \cdot \pi \cdot (f_1 + \Delta f) \cdot \tau = \Delta\phi_2 + 2 \cdot \pi \cdot (N+M)$, wherein $\Delta\phi_1$ is a phase difference of a first delayed signal having a first predefined frequency $f_1$, $\Delta\phi_2$ is a phase difference of a second delayed signal having a second predefined frequency $f_2$, $\Delta f$ is a difference between said second and first predefined frequencies, thereby $f_2 = f_1 + \Delta f$, and M and N are integers;
   d) determining a bound of integer M by using the following relationship:

$$M = \tau \cdot \Delta f - \frac{\Delta\phi_2 - \Delta\phi_1}{2\pi};$$

e) measuring frequency differences $\Delta f_{12}$ and $\Delta f_{13}$ between the first predefined frequency $f_1$, the second predefined frequency $f_2$ and a third predefined frequency $f_3$, giving rise to frequency differences $\Delta f_{12} = f_2 - f_1$ and $\Delta f_{13} = f_3 - f_1$; and
   f) calculating the time delay τ approximation by using the one or more of the following:

a) $\tau = \frac{\Delta\phi_2 - \Delta\phi_1}{2\pi \cdot \Delta f_{12}} + \frac{M_1}{\Delta f_{12}}$; and b) $\tau = \frac{\Delta\phi_3 - \Delta\phi_1}{2\pi \cdot \Delta f_{13}} + \frac{M_2}{\Delta f_{13}}$, wherein $\Delta\phi_3$, is a phase difference of a third delayed signal having the third predefined frequency $f_3$, and $M_1$ and $M_2$ are integers.

2. The method according to claim 1, further comprising determining an approximation of the integer M by considering that $0 < \Delta\phi_1 < 2\pi$ and $0 < \Delta\phi_2 < 2\pi$.

3. The method according to claim 2, further comprising determining the approximation of the integer M by using Δf.

4. The method according to claim 1, further comprising using the calculated time delay τ approximation for determining a value of the integer M.

5. The method according to claim 4, further comprising determining a value of the integer N by using the determined value of the integer M.

6. The method according to claim 5, further comprising calculating the time delay τ by using both determined values of the integers M and N.

* * * * *